United States Patent [19]
Crowley

[11] Patent Number: 5,413,688
[45] Date of Patent: May 9, 1995

[54] SHUTTER APPARATUS FOR A COATING CHAMBER VIEWPORT

[75] Inventor: Daniel T. Crowley, Owatonna, Minn.

[73] Assignee: Viratec Thin Films, Inc., Faribault, Minn.

[21] Appl. No.: 193,326

[22] Filed: Feb. 8, 1994

[51] Int. Cl.$^6$ ............................................. C23C 14/52
[52] U.S. Cl. ........................... 204/298.11; 118/713
[58] Field of Search ................. 204/298.11, 192.13, 204/298.03; 118/713

[56] References Cited

U.S. PATENT DOCUMENTS

| | | | |
|---|---|---|---|
| 4,166,018 | 8/1979 | Chapin | 204/192.12 |
| 4,356,073 | 10/1982 | McKelvey | 204/192.12 |
| 4,422,916 | 12/1983 | McKelvey | 204/192.12 |
| 4,881,335 | 11/1989 | Khoshkish | 40/449 |
| 4,911,810 | 3/1990 | Lauro et al. | 204/192.12 |

FOREIGN PATENT DOCUMENTS

| | | | |
|---|---|---|---|
| 155288 | 6/1982 | Germany | 118/713 |
| 1-165773 | 6/1989 | Japan | 118/713 |
| 5-44032 | 2/1993 | Japan | 118/713 |

*Primary Examiner*—Aaron Weisstuch
*Attorney, Agent, or Firm*—Heller, Ehrman, White & McAuliffe

[57] ABSTRACT

A shutter apparatus capable of protecting the interior surface of an evacuable optical coating chamber viewport from the deposition of off-substrate coating material when in the closed position, and exposing the viewport surface to permit viewing through the viewport into the chamber when in the open position. The movement of the shutter between the open and closed positions is accomplished without breaching the chamber seal.

9 Claims, 2 Drawing Sheets

SHUTTER APPARATUS FOR A COATING CHAMBER VIEWPORT

BACKGROUND OF THE INVENTION

The present invention relates generally to optical coating chambers, and more particularly to a shutter apparatus for an optical coating chamber viewport.

The spatial and temporal film thickness variations of precision coatings, such as multilayer antireflection (AR) coatings, generally must be held to within about plus or minus one percent to maintain the coatings' optical properties. For economical production, it is desirable to apply coatings in a large area, in-line sputtering apparatus about one meter or greater in width.

Large area commercial coating applications, such as the application of thermal control and antireflection coatings to architectural and automobile glazings, most often use DC reactive sputtering as a deposition process. The present invention may be used in connection with DC reactive sputtering as well as with other kinds of deposition processes.

In the DC reactive sputtering process, the articles to be coated are transported through a series of in-line vacuum coating chambers isolated from one another by vacuum locks. Each coating chamber contains one or more cathodes held at a negative potential of about −200 to −1000 volts. The cathodes may be rectangular or cylindrical and are typically 0.10 to 0.30 meters wide and a meter or greater in length. A layer of material to be sputtered is applied to the cathode surface. This surface layer or material is known as the target or target material.

Inside the coating chambers, a sputtering gas discharge is maintained, for example, at a partial vacuum pressure of about 3 millitorr. The sputtering gas comprises a mixture of inert gas, such as argon, with a small proportion of reactive gas, such as oxygen, for the formation of oxides. Ions from the sputtering gas discharge are accelerated into the target and dislodge, or sputter off, atoms of the target material. These atoms, in turn, are deposited on a substrate, such as a glass sheet, passing beneath the target on a conveyor mechanism, such as rollers. The atoms react on the substrate with the reactive gas in the sputtering gas discharge to form a thin film on the substrate.

The architectural glass coating process was made commercially feasible by the development of the magnetically-enhanced planar magnetron. This magnetron has an array of magnets arranged in the form of a closed loop and mounted in a fixed position behind a target. A magnetic field in the form of a closed loop is thus formed in front of the target. The magnetic field traps electrons from the discharge and causes them to travel in a spiral pattern. This creates more intense ionization and higher sputtering rates. The planar magnetron is described in U.S. Pat. No. 4,166,018.

While effective for some coating applications, such as thermal control, the magnetically-enhanced planar magnetron had problems with others, such as high precision AR coatings. Even the simplest AR coating is twice as thick as a thermal control coating. Therefore higher deposition rates are required to obtain a comparable production cost between the two types of coatings. Additionally, AR coatings require a low refractive index material, such as silicon dioxide, as an outer film. At high deposition rates, and with accuracy and long term stability, this material is extremely difficult to deposit using DC reactive sputtering processes. Particularly, thickness variations tend to occur in the outer film, causing perceptible color performance variations.

The rotary or rotating magnetron was developed to overcome some of the problems inherent in the planar magnetron. The rotating magnetron uses a cylindrical cathode. The cathode is rotated continually over a magnetic array which defines the sputtering zone. As such, a new portion of the target is continually presented to the sputtering zone which eases cooling problems and allows higher operating powers. The rotation of the cathode also ensures that the erosion zone comprises the entire circumference of the cathode covered by the sputtering zone. This increases target utilization. The rotating magnetron is described in U.S. Pat. Nos. 4,356,073 and 4,422,916, the entire disclosures of which are hereby incorporated by reference.

In addition to the sputtering and conveyor apparatus, optical coating chambers are also equipped with an opening or openings in their walls containing a transparent material, such as glass or plastic. This "viewport" permits an outside observer to view the coating process as it is occurring inside the chamber. The opportunity to view the sputtering process through a viewport can be important in ensuring that the process is taking place properly.

During the coating process, some amount of coating material is deposited other than on the substrate as a natural consequence of the sputtering method. As sputtering progresses, this off-substrate coating material begins to deposit on the coating chamber walls and other interior components of the coating chamber, including the interior surface of the viewports. Over time, the built-up coating material on the interior surface of the viewports obscures the view into the chamber. This necessitates regular removal and cleaning or replacement of the viewports, resulting in chamber down-time and increased production costs.

Accordingly, an object of the present invention is to provide a shutter apparatus capable of protecting the interior surface of an evacuable optical coating chamber viewport from the deposition of off-substrate coating material when closed, and exposing the viewport surface to permit viewing through the viewport into the coating chamber when open.

It is a further object of the present invention is to provide a shutter apparatus for protecting the interior surface of a viewport from the deposition of off-substrate coating material wherein the shutter may be opened and closed by means that allow the vacuum inside the chamber to be maintained, such as magnetic coupling of the shutter to an actuator outside the chamber.

It is yet another object of the present invention to provide a shutter apparatus the may be quickly and easily installed on a conventional optical coating chamber viewport.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the claims.

SUMMARY OF THE INVENTION

The present invention is directed to a shutter apparatus for an evacuable optical coating chamber viewport, comprising a fixed shutter and a movable shutter movably attached to the fixed shutter. The apparatus further comprises a bracket for mounting the fixed and movable shutters over the interior surface of the viewport and an actuator located over the exterior surface of the viewport. The apparatus additionally comprises a magnetic coupling between the actuator and the movable shutter. The fixed shutter and the movable shutter shield the viewport when the actuator is the closed position, and the movable shutter is movable, without breaching the chamber seal, to expose at least a portion of the interior surface of the viewport to permit viewing therethrough when the actuator is moved towards the open position.

BRIEF DESCRIPTION OF THE DRAWINGS

The accompanying drawings, which are incorporated in and constitute a part of the specification, schematically illustrate a preferred embodiment of the invention and, together with the general description given above and the detailed description of the preferred embodiment given below, serve to explain the principles of the invention.

DESCRIPTION OF THE PREFERRED EMBODIMENT

Figure 1:
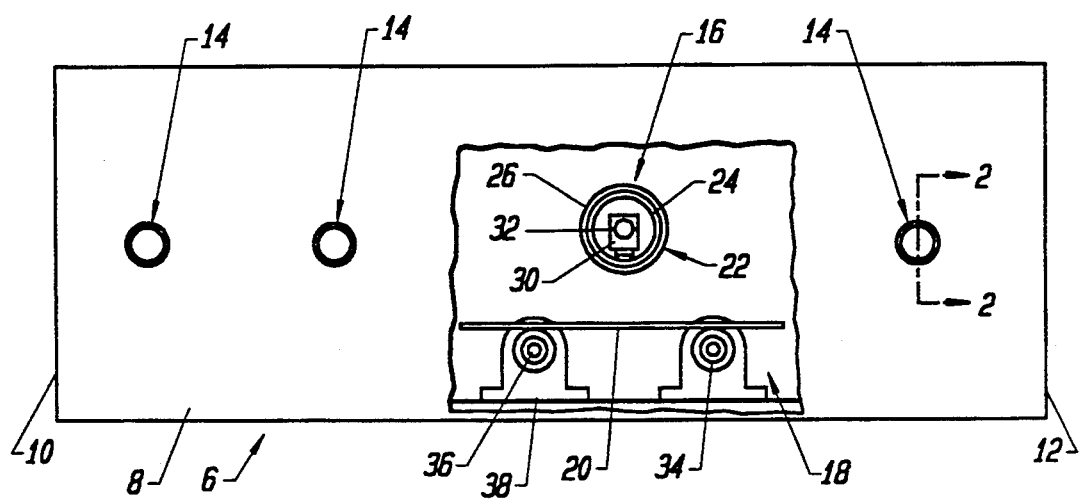
FIG. 1 is a schematic representation, partly broken away, of an optical coating chamber in accordance with the present invention.
Figure 2:
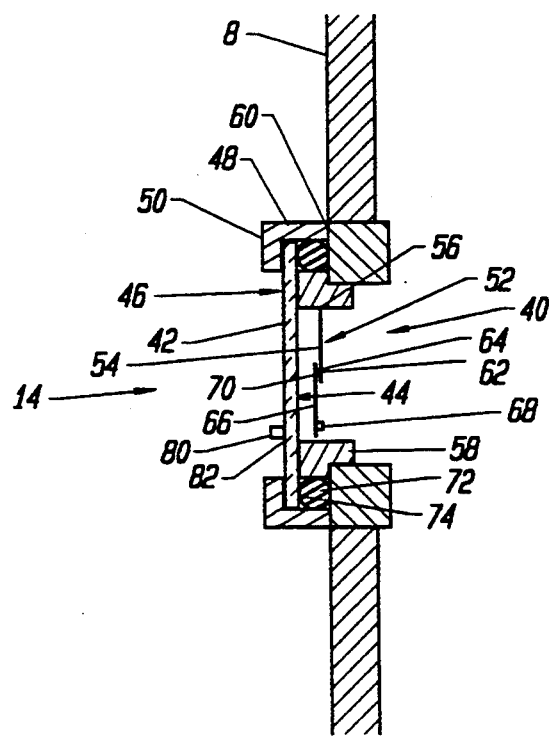
FIG. 2 is an enlarged cross-sectional view along line 2—2 of FIG. 1 of a shuttered viewport in the wall of an optical coating chamber.

The present invention will be described in terms of a preferred embodiment, as illustrated by FIGS. 1, 2 and 3. FIG. 1 depicts an evacuable optical coating chamber 6 composed of an elongated wall 8 closed at its opposite ends by end walls 10 and 12. A series of substantially circular viewports 14 are disposed axially along chamber wall 8.

Mounted within the coating chamber 6, and visible through the broken-away section of the chamber wall 8 in FIG. 1, are a rotating magnetron-type DC reactive sputtering apparatus 16 and a conveyor apparatus 18 for passing the articles 20 to be coated, for example, glass substrates, through the chamber 6. A substantially cylindrical cathode 22 of the rotating magnetron 16 is mounted within the chamber 6. The structure for mounting the cathode in the coating chamber, its drive mechanism and cooling connections are not described in any detail, as such structure is well known in the art.

The coating chamber 6 may be part of a larger enclosure comprising several such coating chambers 6 typical of in-line sputtering apparatus.

The cathode 22 typically comprises a tubular body 24 to which a target material 26 has been applied. The cathode 22 is hollow and has a fixed magnet array 30 suspended within it from the cooling water input tube The substrate 20 is transported through the enclosure or chamber 6 on rollers 34 attached to a shaft 36 mounted in bearings 38.

Figure 3A:
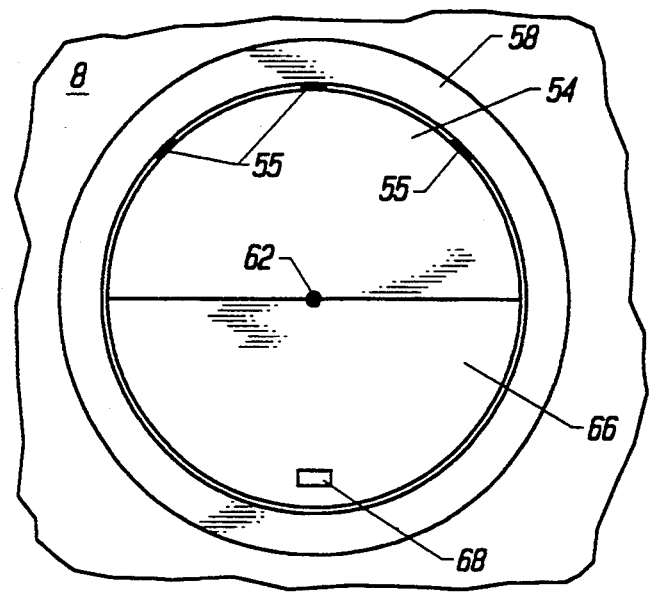
FIG. 3A is a schematic representation of a shuttered viewport in the wall of an optical coating chamber viewed from the coating chamber's interior with the movable shutter in the closed position.
Figure 3B:
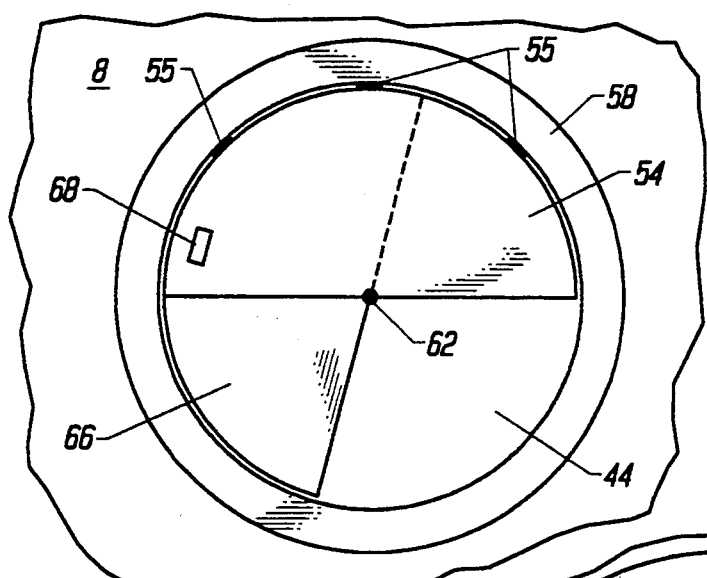
FIG. 3B is a schematic representation of a shuttered viewport in the wall of an optical coating chamber viewed from the coating chamber's interior with the movable shutter in a partially open position.

Referring to FIGS. 2 and 3A & 3B, each viewport 14 may consist of a substantially circular opening 40 in the chamber wall 8 covered by a transparent material 42, such as glass or plastic, having an interior surface 44 and an exterior surface 46. As is known, the transparent material 42 is held in a frame 48 which is attached to the chamber wall 8 over the opening 40 by an adjustable clamp ring 50. Further, an "O" ring seal 72 is disposed between the exterior surface 60 of the chamber wall 8 surrounding the opening 40, and the perimeter 74 of the interior surface of the transparent material 42 to provide a vacuum seal when the adjustable clamp ring 50 is tightened.

The shutter apparatus 52 includes a substantially semi-circular fixed shutter 54 covering the top half of the exposed interior surface 44 of the transparent material 42. The fixed shutter 54 is attached by mechanical or other means, such as welding, at at least one point 55, but preferably along its entire curved edge 56 to the top of a mounting bracket collar 58. The collar 58, in turn, is disposed between the exterior surface 60 of the chamber wall 8 surrounding the opening 40 and the perimeter of the interior surface 44 of the transparent material 42.

The shutter apparatus further includes a pivot 62 rotatably attached to the center of the bottom edge 64 of the fixed shutter 54. A substantially semi-circular movable shutter 66 is rotatably attached at the center of its flat edge 70 to the pivot 62. The movable shutter 66 is composed at least partially of a magnetic material 68 at its lower edge. When in the closed position, as illustrated in FIG. 3A, the movable shutter 66 covers the bottom half of the exposed interior surface 44 of the transparent material 42. The movable shutter 66 is rotatable about the pivot 62 so that at least a portion of the interior surface 44 of the viewport 14 becomes exposed as the movable shutter 66 rotates towards the open position, as illustrated in FIG. 3B.

Figure 4:
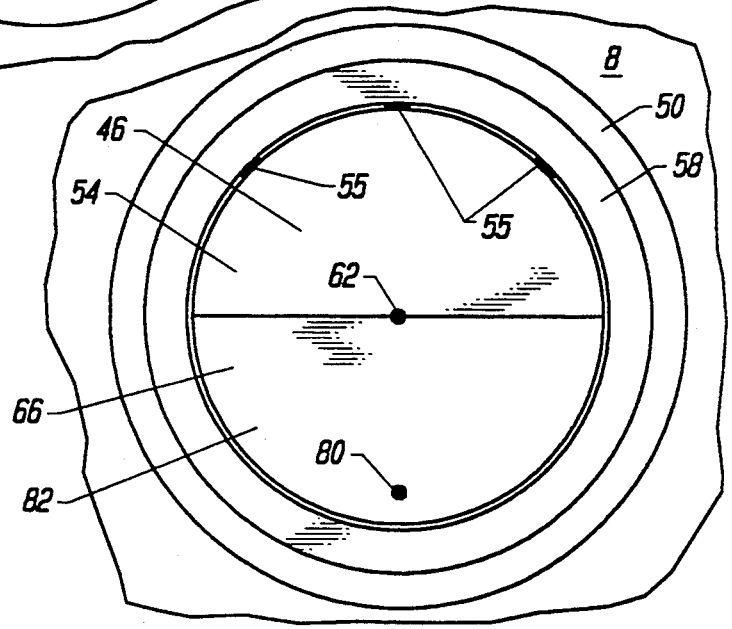
FIG. 4 is a schematic representation of a shuttered viewport in the wall of an optical coating chamber viewed from the coating chamber's exterior with the movable shutter in the closed position.

Referring also to FIG. 4, a magnetic actuator 80 is positioned adjacent to the exterior surface 46 of the transparent material 42 opposite the lower magnetic edge 68 of the movable shutter 66. The actuator 80 and the movable shutter 66 are magnetically coupled such that the shutter apparatus 52 may be opened or closed without breaching the vacuum integrity by movement of the actuator 80 along the perimeter 82 of the external surface 46 of the transparent material 42. The magnetic coupling between the actuator 80 and the movable shutter 66 may comprise a magnetized portion of the actuator 80 having north and south magnetic poles disposed in a first orientation coplanar with the viewport 14, and a magnetized portion 68 of the movable shutter 66 having north and south magnetic poles disposed in a second orientation coplanar with the viewport 14, such that the opposite poles on the actuator 80 and the magnetized portion 68 of the movable shutter 66 are aligned through the viewport 14. The magnetized portion 68 of the movable shutter 66 and the actuator 80 may be magnets.

The apparatus of the present invention has been described in relation to a DC reactive sputtering device in an evacuable optical coating chamber. The invention may also be used in conjunction with other deposition processes, and with other sealed chambers where a viewport is desirable.

In summary, a shuttered viewport for an evacuable optical coating chamber has been described.

The present invention has been described in terms of a preferred embodiment. The invention, however, is not limited to the embodiment depicted and described. Rather, the scope of the invention is defined by the appended claims.

What is claimed is:

1. A shutter apparatus for a viewport of an evacuable optical coating chamber, said viewport having interior and exterior surfaces, comprising:
   a fixed shutter;
   a movable shutter movably attached to said fixed shutter;
   a bracket for mounting said fixed and movable shutters over the interior surface of said viewport, said viewport adapted to be sealed in a wall of said chamber;
   an actuator movable between first and second positions over the exterior surface of said viewport;
   a magnetic coupling between said actuator and said movable shutter; and
   wherein said fixed shutter and said movable shutter shield the interior surface of said viewport when said actuator is in said first position, and said movable shutter is movable to expose at least a portion of the interior surface of said viewport to permit viewing therethrough when said actuator is moved towards said second position.

2. The shutter apparatus of claim 1 further comprising an "O" ring seal for forming a vacuum seal between a wall of said chamber and the interior surface of said viewport.

3. The shutter apparatus of claim 1, wherein said magnetic coupling comprises:
   a magnetized portion of the actuator having north and south magnetic poles disposed in a first orientation coplanar with said viewport;
   a magnetized portion of the movable shutter having north and south magnetic poles disposed in a second orientation coplanar with said viewport; and
   wherein opposite poles on the actuator and the movable shutter are aligned through the viewport.

4. The shutter apparatus of claim 1, wherein the magnetic coupling includes a magnetic portion of the actuator and a magnetic portion of the movable shutter, at least one of which magnetic portions is magnetized.

5. The shutter apparatus of claim 1, wherein said viewport is substantially circular, said fixed shutter is substantially semi-circular, said movable shutter is substantially semi-circular and attached to said fixed shutter at a pivot located at a flat edge of said fixed shutter approximately over the center of the interior surface of said viewport, said actuator is movable from said first position to said second position along a substantially semi-circular path over the exterior surface of the viewport, and said movable shutter is rotatable about the pivot.

6. A shutter apparatus for a viewport in a wall of an evacuable optical coating chamber, said viewport having interior and exterior surfaces, comprising:
   a fixed shutter;
   a movable shutter rotatably attached to said fixed shutter at a pivot;
   a mounting bracket collar attached to said fixed shutter for mounting said fixed and movable shutters over the interior surface of said viewport;
   means for forming a vacuum seal between a wall of said chamber and the interior surface of said viewport;
   an actuator movable between first and second positions over the exterior surface of said viewport;
   a magnetic coupling between said actuator and said movable shutter; and
   wherein said fixed shutter and said movable shutter shield the interior surface of said viewport when said actuator is in said first position, and said movable shutter is movable to expose at least a portion of the interior surface of said viewport to permit viewing therethrough when said actuator is moved towards said second position.

7. A shuttered viewport for an evacuable optical coating chamber, comprising:
   a transparent material having interior and exterior surfaces, mounted in a frame adapted to cover over an opening in a wall of the evacuable coating chamber;
   means for fixing said frame to said chamber wall;
   a fixed shutter;
   a movable shutter, movably attached to said fixed shutter;
   a mounting bracket collar for mounting said fixed and movable shutters over the interior surface of said transparent material;
   an "O" ring seal for forming a vacuum seal between a wall of said chamber and the interior surface of said transparent material;
   an actuator movable between first and second positions over the exterior surface of said transparent material;
   a magnetic coupling between said actuator and said movable shutter; and
   wherein said fixed shutter and said movable shutter shield the interior surface of said transparent material when said actuator is in said first position, and said movable shutter is movable to expose at least a part of the interior surface of said transparent material to permit viewing therethrough when said actuator is moved towards said second position.

8. An apparatus comprising:
   an evacuable coating chamber having an elongated wall;
   at least one viewport in said wall, said viewport having interior and exterior surfaces, and said viewport being sealed in a wall of said chamber; and
   a shutter apparatus for the viewport, including:
      a fixed shutter,
      a movable shutter movably attached to said fixed shutter,
      a bracket for mounting said fixed and movable shutters over the interior surface of said viewport,
      an actuator at the exterior surface of said viewport for causing movement of said movable shutter, and
      wherein said fixed shutter and said movable shutter shield the interior surface of said viewport when said actuator is in a first position, and said movable shutter is movable to expose at least a portion of the interior surface of said viewport to permit viewing therethrough when said actuator is moved towards a second position.

9. A shutter apparatus for an evacuable coating chamber viewport, said viewport having interior and exterior surfaces, comprising:
   a fixed shutter,
   a movable shutter movably attached to said fixed shutter,
   a bracket for mounting said fixed and movable shutters over the interior surface of said viewport,
   an actuator at the exterior surface of said viewport for causing movement of said movable shutter, and
   wherein said fixed shutter and said movable shutter shield the interior surface of said viewport when said actuator is in a first position, and said movable shutter is movable to expose at least a portion of the interior surface of said viewport to permit viewing therethrough when said actuator is moved towards a second position.

* * * * *